US010483241B1

(12) United States Patent
Duesman et al.

(10) Patent No.: US 10,483,241 B1
(45) Date of Patent: Nov. 19, 2019

(54) SEMICONDUCTOR DEVICES WITH THROUGH SILICON VIAS AND PACKAGE-LEVEL CONFIGURABILITY (71) Applicant: Micron Technology, Inc., Boise, ID (US)

(72) Inventors: Kevin G. Duesman, Boise, ID (US); James E. Davis, Meridian, ID (US); Warren L. Boyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/020,792

(22) Filed: Jun. 27, 2018

(51) Int. Cl.
H01L 25/065 (2006.01)
H01L 23/00 (2006.01)
(Continued)

(52) U.S. Cl.
CPC .......... H01L 25/0657 (2013.01); H01L 24/05 (2013.01); H01L 25/50 (2013.01);
(Continued)

(58) Field of Classification Search
CPC ............. H01L 27/0288; H01L 27/0292; H01L 27/0248; H01L 2225/06541; H01L 2225/06544; H01L 25/0657; H01L 25/06544; H01L 2224/05009; H01L 2224/05076; H01L 2224/05078;
(Continued)

(56) References Cited

U.S. PATENT DOCUMENTS 6,342,724 B1  1/2002  Wark et al.
9,711,500 B1  7/2017  Walker
(Continued)

FOREIGN PATENT DOCUMENTS

CN  1905178 B  9/2010
JP  2006135302 A  5/2006
(Continued)

OTHER PUBLICATIONS

International Application No. PCT/US2018/050072—International Search Report and Written Opinion, dated Jan. 11, 2019, 11 pages.
(Continued)

Primary Examiner — David A Zarneke
(74) Attorney, Agent, or Firm — Perkins Coie LLP (57) ABSTRACT A semiconductor device assembly includes a substrate and a die coupled to the substrate, the die including a first contact pad electrically coupled to a first circuit on the die including an active circuit element, a first TSV electrically coupling the first contact pad to a first backside contact pad, and a second contact pad electrically coupled to a second circuit including only passive circuit elements. The substrate includes a substrate contact electrically coupled to the first and second contact pads. The assembly can further include a second die including a third contact pad electrically coupled to a third circuit including a second active circuit element, and a fourth contact pad electrically coupled to a fourth circuit on the second die including only passive circuit elements. The substrate contact can be electrically coupled to the third contact pad, but electrically disconnected from the fourth contact pad.

21 Claims, 8 Drawing Sheets (51) Int. Cl.
- H01L 27/02 (2006.01)
- H01L 25/00 (2006.01)
- H01L 23/498 (2006.01)
- H01L 23/60 (2006.01)
- H01L 23/48 (2006.01)
- H01L 23/538 (2006.01)
- H01L 23/482 (2006.01)

(52) U.S. Cl.
CPC ........ *H01L 27/0288* (2013.01); *H01L 23/481* (2013.01); *H01L 23/4824* (2013.01); *H01L 23/49827* (2013.01); *H01L 23/49838* (2013.01); *H01L 23/5384* (2013.01); *H01L 23/5386* (2013.01); *H01L 23/60* (2013.01); *H01L 27/0248* (2013.01); *H01L 27/0292* (2013.01); *H01L 2224/0508* (2013.01); *H01L 2224/05009* (2013.01); *H01L 2224/05076* (2013.01); *H01L 2224/05078* (2013.01); *H01L 2224/05085* (2013.01); *H01L 2224/05086* (2013.01); *H01L 2224/8011* (2013.01); *H01L 2224/8111* (2013.01); *H01L 2224/8211* (2013.01); *H01L 2224/8311* (2013.01); *H01L 2224/8411* (2013.01); *H01L 2224/8511* (2013.01); *H01L 2224/8611* (2013.01); *H01L 2225/06513* (2013.01); *H01L 2225/06541* (2013.01); *H01L 2225/06544* (2013.01)

(58) Field of Classification Search
CPC ... H01L 2224/0508; H01L 2224/05085; H01L 2224/05086; H01L 2224/8011; H01L 2224/8111; H01L 2224/8211; H01L 2224/8311; H01L 2224/8411; H01L 2224/8511; H01L 2224/8611; H01L 23/60; H01L 23/49827; H01L 23/481; H01L 23/4824; H01L 23/49838; H01L 23/5384; H01L 23/5386; H01L 23/498
See application file for complete search history.

(56) References Cited

U.S. PATENT DOCUMENTS

| | | |
|---|---|---|
| 2003/0127704 A1 | 7/2003 | Kobayashi et al. |
| 2004/0140860 A1 | 7/2004 | Miller |
| 2004/0212083 A1 | 10/2004 | Yang |
| 2006/0071320 A1 | 4/2006 | Shibata et al. |
| 2007/0117266 A1 | 5/2007 | Ball |
| 2009/0321954 A1 | 12/2009 | Oh |
| 2012/0068306 A1 | 3/2012 | Song et al. |
| 2013/0009278 A1 | 1/2013 | Lee |
| 2013/0228867 A1 | 9/2013 | Suematsu et al. |
| 2014/0077369 A1* | 3/2014 | Liang ................. H01L 23/49827 257/738 |
| 2014/0082345 A1 | 3/2014 | Asano et al. |
| 2014/0197526 A1 | 7/2014 | Yoo et al. |
| 2015/0311094 A1 | 10/2015 | Whang et al. |
| 2016/0225734 A1 | 8/2016 | Veches et al. |
| 2016/0247747 A1 | 8/2016 | Janzen et al. |
| 2017/0025402 A1 | 1/2017 | Opoczynski et al. |
| 2017/0098631 A1* | 4/2017 | Kikuchi .................. H01L 24/02 |
| 2018/0076807 A1 | 3/2018 | Devarajan et al. |
| 2018/0109251 A1 | 4/2018 | Djelassi et al. |
| 2018/0294251 A1 | 10/2018 | Liu et al. |
| 2018/0315720 A1* | 11/2018 | Liao ........................ H01L 23/66 |
| 2019/0148342 A1* | 5/2019 | Hu ....................... H01L 25/0657 |

FOREIGN PATENT DOCUMENTS

| | | |
|---|---|---|
| KR | 20120017564 A | 2/2012 |
| TW | 200301010 A | 6/2003 |

OTHER PUBLICATIONS

Davis et al., Unpublished U.S. Appl. No. 15/811,579; entitled: "Semiconductor Devices With Post-Probe Configurability", filed Nov. 13, 2017, 30 pages.

Davis et al., Unpublished U.S. Appl. No. 15/811,572; entitled: "Semiconductor Devices With Package-Level Configurability", filed Nov. 13, 2017, 33 pages.

International Application No. PCT/US2018/053862—International Search Report and Written Opinion, dated Mar. 11, 2019, 12 pages.

TW Patent Application No. 107136282—Taiwanese Office Action and Search Report, dated May 6, 2019, with English Translation, 14 pages.

International Application No. PCT/US2019/036696—International Search Report and Written Opinion, dated Sep. 27, 2019, 14 pages.

* cited by examiner

SEMICONDUCTOR DEVICES WITH THROUGH SILICON VIAS AND PACKAGE-LEVEL CONFIGURABILITY

CROSS-REFERENCE TO RELATED APPLICATIONS

This application contains subject matter related to a previously-filed U.S. Patent Application by James E. Davis, Kevin G. Duesman, Jeffrey P. Wright, and Warren L. Boyer, entitled "SEMICONDUCTOR DEVICES WITH POST-PROBE CONFIGURABILITY". The related application, of which the disclosure is incorporated by reference herein, is assigned to Micron Technology, Inc., and was filed on Nov. 13, 2017 as U.S. patent application Ser. No. 15/811,579.

This application contains subject matter related to a previously-filed U.S. Patent Application by James E. Davis, John. B. Pusey, Zhiping Yin, and Kevin G. Duesman, entitled "SEMICONDUCTOR DEVICES WITH PACKAGE-LEVEL CONFIGURABILITY". The related application, of which the disclosure is incorporated by reference herein, is assigned to Micron Technology, Inc., and was filed on Nov. 13, 2017 as U.S. patent application Ser. No. 15/811,572.

TECHNICAL FIELD

The present disclosure generally relates to semiconductor devices, and more particularly relates to semiconductor devices with through-silicon vias (TSVs) and package-level configurability.

BACKGROUND

Packaged semiconductor dies, including memory chips, microprocessor chips, and imager chips, typically include one or more semiconductor dies mounted on a substrate and encased in a plastic protective covering or covered by a heat-conducting lid. The die can include active circuits (e.g., providing functional features such as memory cells, processor circuits, and/or imager devices) and/or passive features (e.g., capacitors, resistors, etc.) as well as bond pads electrically connected to the circuits. The bond pads can be electrically connected to terminals outside the protective covering to allow the die to be connected to higher level circuitry.

Figure 1:
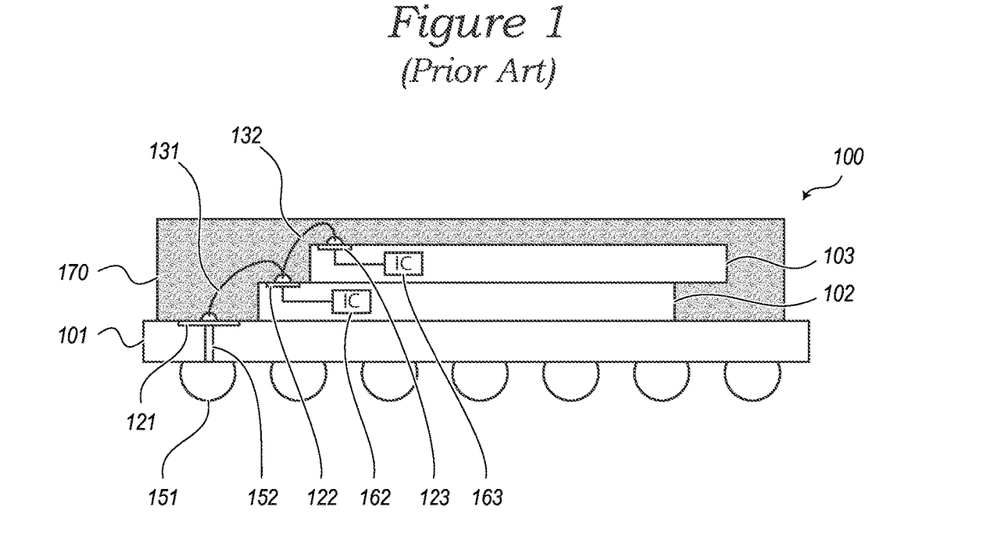
FIG. 1 is a simplified partial cross-sectional view of a semiconductor device assembly including multiple semiconductor dies stacked on a substrate.

For example, FIG. 1 is a simplified partial cross-sectional view of a semiconductor device assembly 100 including multiple semiconductor dies 102 and 103 stacked in a shingled fashion on a substrate 101 and covered by an encapsulant 170. Each die includes one or more contact pads, such as contact pads 122 and 123 to provide connectivity to a corresponding integrated circuit, such as circuits 162 and 163. The contact pads 122 and 123 can be connected to a substrate contact 121 by wirebonds 131 and 132 (shown in a daisy-chain configuration), to provide connectivity to circuits 162 and 163 via solder ball 151 (by way of via 152).

With some semiconductor dies, various bond pads can be connected to multiple circuits in a die. For example, in a NAND memory die, a single bond pad may be connected to both an active driver circuit and a passive ESD protection circuit (e.g., including one or more capacitors). The ESD protection circuit can be designed to provide a desired amount of capacitance to protect the single active driver circuit. In a semiconductor device assembly including multiple such NAND memory dies with active driver circuits connected in parallel (e.g., with the corresponding bond pad from each NAND memory die connected to the same external terminal), the excess capacitance provided by the ESD protection circuit from each die being connected in parallel can degrade device performance. This can be addressed by designing different NAND memory dies for different package densities (e.g., a NAND memory die configured to be packaged alone, a different NAND memory die with less capacitive ESD protection circuits configured to be packaged in a stack of two, yet another NAND memory die with even less capacitive ESD protection circuits configured to be packaged in a stack of four, etc.), but designing and fabricating multiple different semiconductor dies for each possible package configuration is prohibitively expensive. Accordingly, there is a need for a semiconductor die that can be configured with different amounts of ESD protection depending upon the configuration in which the die is packaged.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, when semiconductor dies with an ESD protection circuit connected to the same bond pad as an active circuit (e.g., a driver circuit) are connected together in different package densities, the amount of capacitance provided by the ESD protection circuit cannot be optimized for each package density. Accordingly, several embodiments of semiconductor devices in accordance with the present technology can provide package-level configurability of a provided capacitance to overcome this challenge.

Several embodiments of the present technology are directed to semiconductor device assemblies including a substrate and a die coupled to the substrate. The die includes a first contact pad electrically coupled to a first circuit on the die including at least one active circuit element, a first through-silicon via (TSV) electrically coupling the first contact pad to a first backside contact pad of the die, and a second contact pad electrically coupled to a second circuit on the die including only passive circuit elements. The substrate includes a substrate contact electrically coupled to both the first contact pad and the second contact pad on the die.

Specific details of several embodiments of semiconductor devices are described below. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

Figure 2:
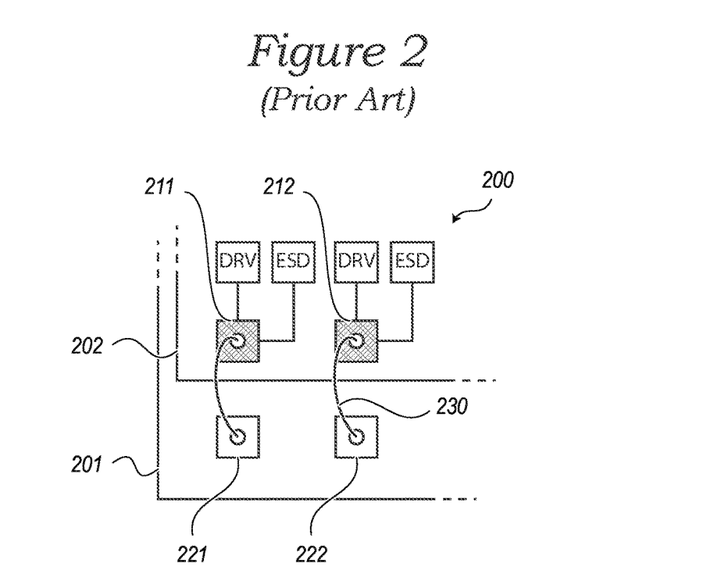
FIG. 2 is a simplified schematic view of a semiconductor device assembly.

FIG. 2 is a simplified schematic view of a semiconductor device assembly 200 including a semiconductor die 202 coupled to a substrate 201. The die includes contact pads, such as contact pads 211 and 212, which are each connected to both an integrated circuit with active components (schematically illustrated as a driver (DRV) circuit), and an integrated circuit with passive components (schematically illustrated as an electrostatic discharge (ESD) protection circuit). The contact pads 211 and 212 are electrically coupled (e.g., by wirebonds 230) to substrate contacts 221 and 222. As can be seen with reference to FIG. 2, if semiconductor die 202 has been configured with an amount of capacitance suitable to provide ESD protection for a single driver circuit, then adding another such semiconductor die to the assembly 200 can undesirably increase the capacitance "seen" by the substrate contacts 221 and 222.

Figure 3:
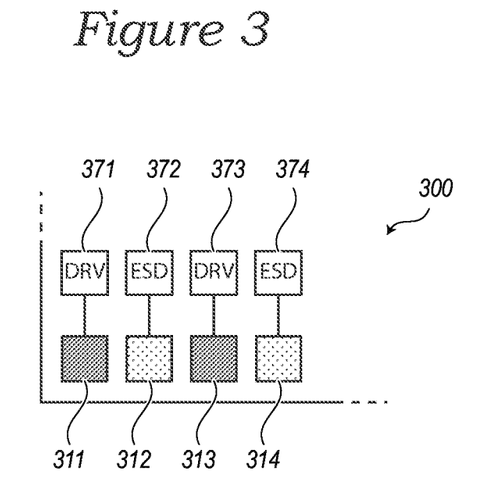
FIG. 3 is a simplified schematic view of a semiconductor device in accordance with an embodiment of the present technology.

To address this problem, embodiments of the present technology can provide a semiconductor die in which an active circuit, and the passive circuit configured to provide ESD protection thereto, are connected to separate contact pads, such that a desired amount of capacitance can be provided regardless of the number of dies provided in a package assembly. For example, FIG. 3 is a simplified schematic view of a semiconductor device 300 in accordance with an embodiment of the present technology. Semiconductor device 300 includes a plurality of contact pads, such as first through fourth contact pads 311-314, for providing connectivity to circuits in the semiconductor device 300. For example, the first contact pad 311 provides connectivity to a first circuit 371 with active components (e.g., a driver circuit), and the second contact pad 312 provides connectivity to a second circuit 372 with passive components (e.g., an ESD protection circuit). Similarly, the third contact pad 313 provides connectivity to a third circuit 373 with active components (e.g., a driver circuit), and the fourth contact pad 314 provides connectivity to a fourth circuit 374 with passive components (e.g., an ESD protection circuit). By providing each passive circuit with a dedicated contact pad, semiconductor device 300 makes possible different packaging densities utilizing multiple identical semiconductor dies, while providing a desired amount of ESD protection and without, e.g., excess capacitance causing the driver circuits 371 and 373 to consume excess power.

Figure 4:
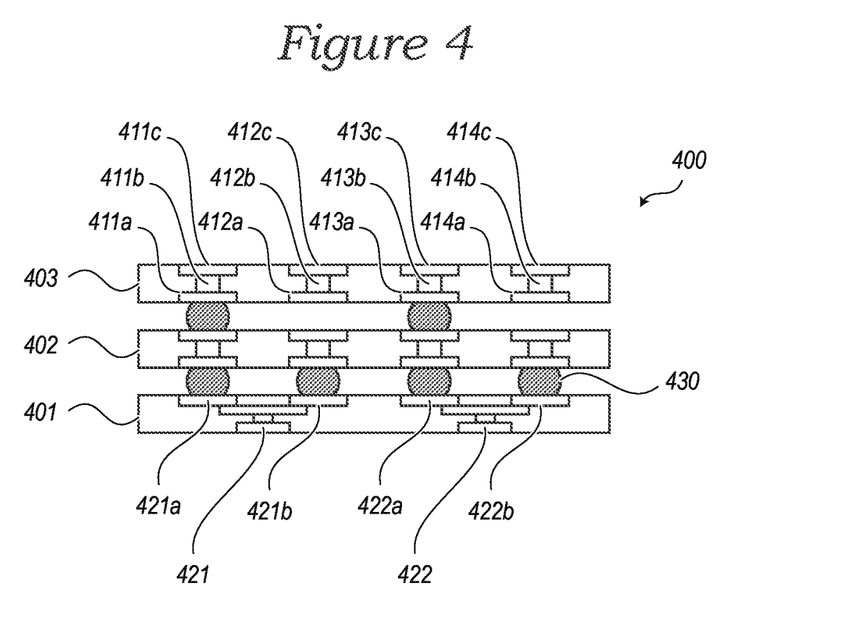
FIGS. 4-6 are simplified schematic cross-sectional views of semiconductor device assemblies in accordance with embodiments of the present technology.

This can be better understood with reference to FIG. 4, which is a simplified schematic view of a semiconductor device assembly 400 in accordance with an embodiment of the present technology. Assembly 400 includes a substrate 401 and two semiconductor dies 402 and 403 (e.g., identical semiconductor dies). Like the semiconductor device 300 illustrated in FIG. 3 above, each semiconductor die 402 and 403 includes multiple contact pads, such as first through fourth contact pads 411a-414a, each providing connectivity to either a circuit with active components (e.g., a driver circuit) or a circuit with passive components (e.g., an ESD protection circuit). Each contact pad 411a-414a is connected (e.g., by a corresponding through-silicon via (TSV) 411b-414b) to a corresponding backside pad 411c-414c, to provide connectivity to dies higher in the assembly 400. Because each ESD protection circuit of each semiconductor die 402 and 403 is provided with a dedicated contact pad (e.g., contact pads 412a and 414a), the assembly 400 can be configured with a desired amount of ESD protection for each driver circuit.

As can be seen with reference to FIG. 4, the substrate 401 includes two substrate contacts 421 and 422. The first substrate contact 421 is connected (e.g., by metallization features in the substrate 401) to two substrate backside contacts 421a and 421b, and is further connected (e.g., by solder balls 430) to the first contact pad 411a (corresponding to a driver circuit) of each semiconductor die 402 and 403 in the assembly 400, but is connected to the second contact pad 412a (corresponding to an ESD protection circuit) of only one semiconductor die 402 in the assembly 400 (e.g., due to the omission of a solder ball that would provide a connection between the second contact pad 412a of the upper semiconductor die 403 and the second backside contact pad 412c of the lower semiconductor die 402). Similarly, the second substrate contact 422 is connected (e.g., by metallization features in the substrate 401) to two substrate backside contacts 422a and 422b, and is further connected (e.g., by solder balls 430) to the third contact pad 413a (corresponding to a driver circuit) of each semiconductor die 402 and 403 in the assembly 400, but is connected to the fourth contact pad 414a (corresponding to an ESD protection circuit) of only one semiconductor die 402 in the assembly 400 (e.g., due to the omission of a solder ball that would provide a connection between the fourth contact pad 414a of the upper semiconductor die 403 and the fourth backside contact pad 414c of the lower semiconductor die 402). By leaving electrically disconnected from the substrate contacts 421 and 422 the second and fourth contact pads 412a and 414a (corresponding to ESD protection circuits) on the upper semiconductor die 403, the capacitance of the circuit to which each substrate contact 421 and 422 is connected is less than it would be if ESD protection circuits from each die in the assembly 400 were connected.

Although FIG. 4 has been described and illustrated as including multiple identical semiconductor dies, in other embodiments of the present technology semiconductor device assemblies with different types of dies can be provided with similar features. For example, in one embodiment a semiconductor device assembly can include a logic die and a memory die, one or both of which can include discrete contact pads for passive circuits to be connected as desired during packaging. Moreover, although FIG. 4 has been described and illustrated as including semiconductor dies with two driver circuits, it will be readily apparent to those skilled in the art that this embodiment is but one example, and semiconductor dies with different numbers of driver circuits can also be provided. Furthermore, FIG. 4 has been described and illustrated as providing contact pads for ESD protection circuits separate from contact pads for driver circuits, in other embodiments circuits with other active elements besides drivers can be provided, and other circuits including only passive components (e.g., resistors, capacitors, inductors, etc.) can likewise be provided.

Figure 5:
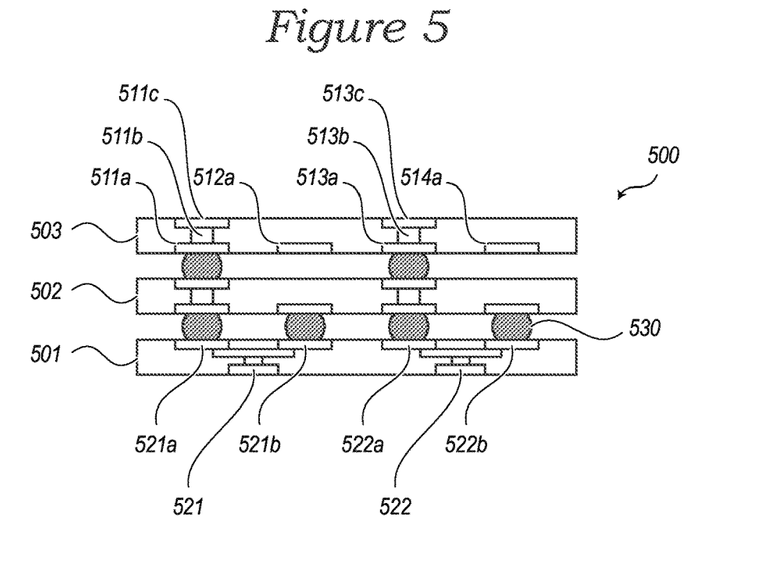

Although FIG. 4 has been described and illustrated with TSVs corresponding to each contact pad of a semiconductor die, in other embodiments of the present technology, the TSVs may be omitted from the contact pads that provide connectivity to ESD circuits, as it is not infrequently the case that only the ESD circuits of the lowest die, if any, in a semiconductor device assembly is connected to the substrate contacts. For example, FIG. 5 is a simplified schematic cross-sectional view of a semiconductor device assembly 500 in accordance with an embodiment of the present technology. Assembly 500 includes a substrate 501 and two semiconductor dies 502 and 503, each including multiple contact pads, such as first through fourth contact pads 511a-514a, for providing connectivity to either a circuit with active components (e.g., a driver circuit) or a circuit with passive components (e.g., an ESD protection circuit). The contact pads 511a and 513a corresponding to the circuits with active components are connected (e.g., by corresponding TSVs 511b and 513b) to corresponding backside pads 511c and 513c, to provide connectivity to dies higher in the assembly 500. TSVs and backside contact pads are not, however, provided for those contact pads 512a and 514a corresponding to circuits including only passive components.

As can be seen with reference to FIG. 5, the substrate 501 includes two substrate contacts 521 and 522. The first substrate contact 521 is connected (e.g., by metallization features in the substrate 501) to two substrate backside contacts 521a and 521b, and is further connected (e.g., by solder balls 530) to the first contact pad 511a (corresponding to a driver circuit) of each semiconductor die 502 and 503 in the assembly 500, but is connected to the second contact pad 512a (corresponding to an ESD protection circuit) of only one semiconductor die 502 in the assembly 500 (e.g., due to the omission of a TSV and backside contact pad corresponding to the second contact pad 512a). Similarly, the second substrate contact 522 is connected (e.g., by metallization features in the substrate 501) to two substrate backside contacts 522a and 522b, and is further connected (e.g., by solder balls 530) to the third contact pad 513a (corresponding to a driver circuit) of each semiconductor die 502 and 503 in the assembly 500, but is connected to the fourth contact pad 514a (corresponding to an ESD protection circuit) of only one semiconductor die 502 in the assembly 500 (e.g., due to the omission of a TSV and backside contact pad corresponding to the fourth contact pad 514a). By leaving electrically disconnected from the substrate contacts 521 and 522 the second and fourth contact pads 512a and 514a (corresponding to ESD protection circuits) on the upper semiconductor die 503, the capacitance of the circuit to which each substrate contact 521 and 522 is connected is less than it would be if ESD protection circuits from each die in the assembly 500 were connected.

Figure 6:
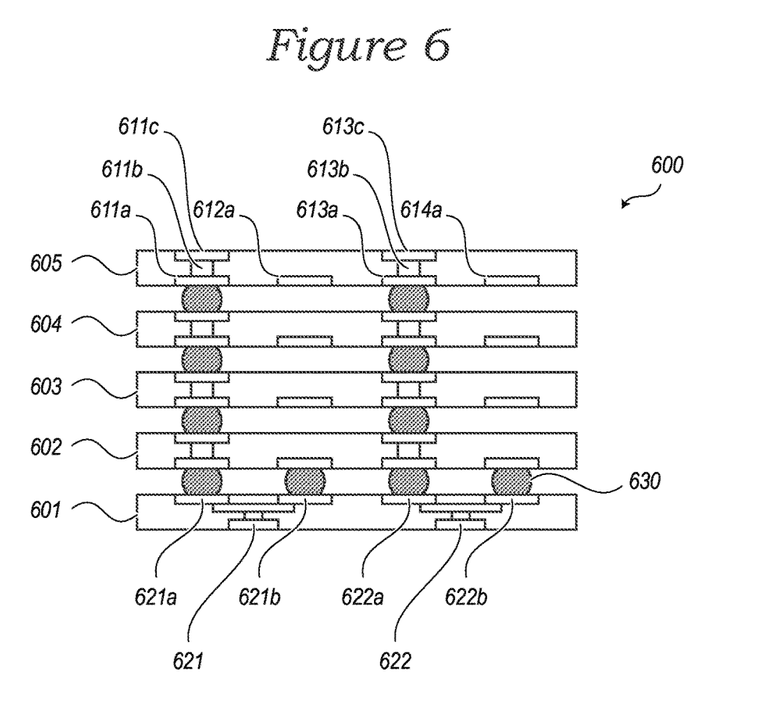

Although in the foregoing examples semiconductor device assemblies have been described and illustrated as including two semiconductor dies, in other embodiments of the present technology, semiconductor device assemblies can include any other number of dies, such as 4, 8, 10, 12, 16, 32, etc. For example, FIG. 6 is a simplified schematic cross-sectional view of a semiconductor device 600 in accordance with an embodiment of the present technology. Semiconductor device 600 includes a substrate 601 and four semiconductor dies 602-605, each including multiple contact pads, such as first through fourth contact pads 611a-614a, for providing connectivity to either a circuit with active components (e.g., a driver circuit) or a circuit with passive components (e.g., an ESD protection circuit). The contact pads 611a and 613a corresponding to the circuits with active components are connected (e.g., by corresponding TSVs 611b and 613b) to corresponding backside pads 611c and 613c, to provide connectivity to dies higher in the assembly 600. TSVs and backside contact pads are not, however, provided for those contact pads 612a and 614a corresponding to circuits including only passive components.

As can be seen with reference to FIG. 6, the substrate 601 includes two substrate contacts 621 and 622. The first substrate contact 621 is connected (e.g., by metallization features in the substrate 601) to two substrate backside contacts 621a and 621b, and is further connected (e.g., by solder balls 630) to the first contact pad 611a (corresponding to a driver circuit) of each semiconductor die 602-605 in the assembly 600, but is connected to the second contact pad 612a (corresponding to an ESD protection circuit) of only one semiconductor die 602 in the assembly 600 (e.g., due to the omission of a TSV and backside contact pad corresponding to the second contact pad 612a). Similarly, the second substrate contact 622 is connected (e.g., by metallization features in the substrate 601) to two substrate backside contacts 622a and 622b, and is further connected (e.g., by solder balls 630) to the third contact pad 613a (corresponding to a driver circuit) of each semiconductor die 602-605 in the assembly 600, but is connected to the fourth contact pad 614a (corresponding to an ESD protection circuit) of only one semiconductor die 602 in the assembly 600 (e.g., due to the omission of a TSV and backside contact pad corresponding to the fourth contact pad 614a). By leaving electrically disconnected from the substrate contacts 621 and 622 the second and fourth contact pads 612a and 614a (corresponding to ESD protection circuits) on the upper semiconductor dies 603-605, the capacitance of the circuit to which each substrate contact 621 and 622 is connected is less than it would be if ESD protection circuits from each die in the assembly 600 were connected.

Figure 7:
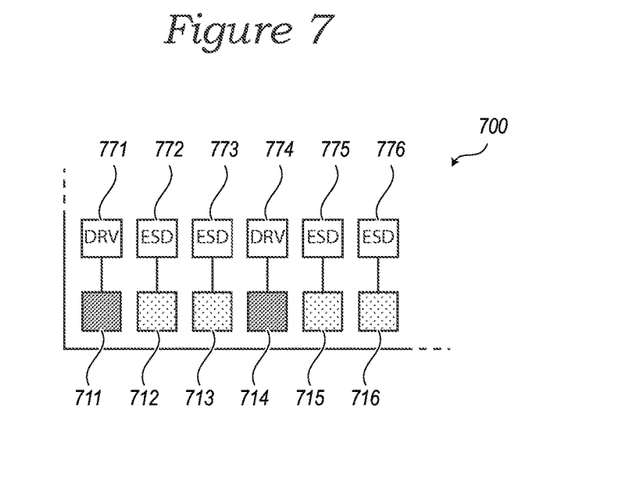
FIG. 7 is a simplified schematic view of a semiconductor device in accordance with an embodiment of the present technology.

Although in the foregoing examples semiconductor dies have been described and illustrated as including a single ESD protection circuit corresponding to each driver circuit, in other embodiments of the present technology, additional configurability can be provided by including multiple ESD protection circuits with dedicated contact pads corresponding to each driver circuit on a semiconductor die. For example, FIG. 7 is a simplified schematic view of a semiconductor device 700 in accordance with an embodiment of the present technology. Semiconductor device 700 includes a plurality of contact pads, such as first through sixth contact pads 711-716, for providing connectivity to circuits in the semiconductor device 700. For example, the first contact pad 711 provides connectivity to a first circuit 771 with active components (e.g., a driver circuit), and the second and third contact pads 712 and 713 provide connectivity to second and third circuits 772 and 773, respectively, which include only passive components (e.g., ESD protection circuits). Similarly, the fourth contact pad 714 provides connectivity to a fourth circuit 774 with active components (e.g., a driver circuit), and the fifth and sixth contact pads 715 and 716 provide connectivity to fifth and sixth circuits 775 and 776, respectively, which include only passive components (e.g., ESD protection circuits). By providing each active circuit with multiple corresponding passive circuits, each with their own dedicated contact pad, semiconductor device 700 makes possible different packaging densities utilizing multiple identical semiconductor dies, while providing a desired amount of ESD protection without, e.g., excess capacitance causing the driver circuits 771 and 774 to consume excess power.

Figure 8:
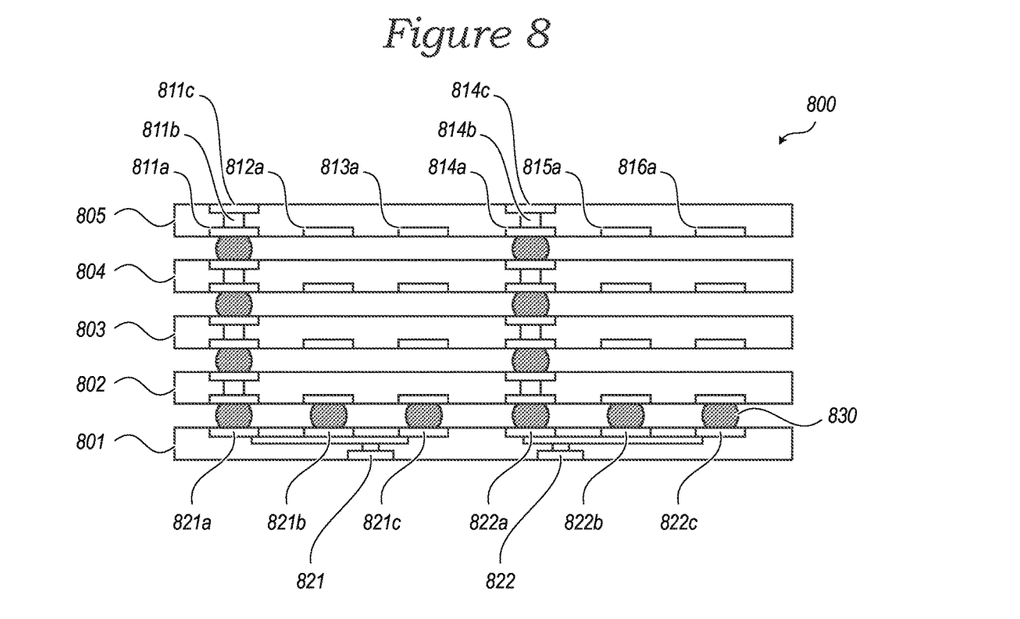
FIGS. 8-11 are simplified schematic views of semiconductor device assemblies in accordance with embodiments of the present technology.

This can be better understood with reference to FIG. 8, which is a simplified schematic cross-sectional view of a semiconductor device assembly 800 in accordance with an embodiment of the present technology. Assembly 800 includes a substrate 801 and four semiconductor dies 802-805 (e.g., identical semiconductor dies). Like the semiconductor device 700 illustrated in FIG. 7 above, each semiconductor die 802-805 includes multiple contact pads, such as first through sixth contact pads 811a-816a, each providing connectivity to either a circuit with active components (e.g., a driver circuit) or a circuit with passive components (e.g., an ESD protection circuit). The contact pads 811a and 814a corresponding to the circuits with active components are connected (e.g., by corresponding TSVs 811b and 814b) to corresponding backside pads 811c and 814c, to provide connectivity to dies higher in the assembly 800. TSVs and backside contact pads are not, however, provided for those contact pads 812a, 813a, 815a and 816a corresponding to circuits including only passive components. Because each ESD protection circuit is provided with a dedicated contact pad, the assembly 800 can be configured with a desired amount of ESD protection for each driver circuit.

As can be seen with reference to FIG. 8, the substrate 801 includes two substrate contacts 821 and 822. The first substrate contact 821 is connected (e.g., by metallization features in the substrate 801) to three substrate backside contacts 821a-821c, and is further connected (e.g., by solder balls 830) to the first contact pad 811a (corresponding to a driver circuit) of each semiconductor die 802-805 in the assembly 800, but is connected to the second and third contact pads 812a and 813a (corresponding to ESD protection circuits) of only one semiconductor die 802 in the assembly 800 (e.g., due to the omission of TSVs and backside contact pads corresponding to the second and third contact pads 812a and 813a). Similarly, the second substrate contact 822 is connected (e.g., by metallization features in the substrate 801) to three substrate backside contacts 822a-822c, and is further connected (e.g., by solder balls 830) to the fourth contact pad 814a (corresponding to a driver circuit) of each semiconductor die 802-805 in the assembly 800, but is connected to the fifth and sixth contact pads 815a and 816a (corresponding to ESD protection circuits) of only one semiconductor die 802 in the assembly 800 (e.g., due to the omission of TSVs and backside contact pads corresponding to the fifth and sixth contact pads 815a and 816a). By leaving electrically disconnected from the substrate contacts 821 and 822 the second, third, fifth and sixth contact pads 812a, 813a, 815a and 816a (corresponding to ESD protection circuits) on the upper semiconductor dies 803-805, the capacitance of the circuit to which each substrate contact 821 and 822 is connected is less than it would be if ESD protection circuits from each die in the assembly 800 were connected.

Figure 9:
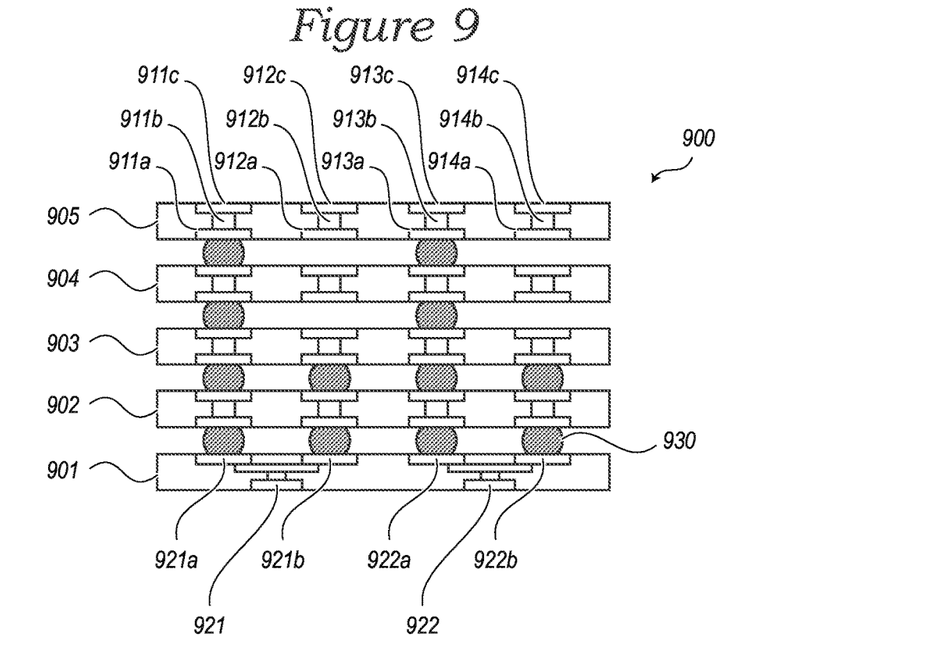

Although in the foregoing embodiments, semiconductor device assemblies are illustrated and described in which the ESD protection circuits of only one die in the assembly are connected to the substrate contacts, in other embodiments a semiconductor device assembly can include multiple dies that have ESD protection circuits connected to the substrate contact(s) thereof. For example, FIG. 9 is a simplified schematic cross-sectional view of a semiconductor device assembly 900 in accordance with an embodiment of the present technology. Assembly 900 includes a substrate 901 and four semiconductor dies 902-905 (e.g., identical semiconductor dies), each including multiple contact pads, such as first through fourth contact pads 911a-914a, for providing connectivity to either a circuit with active components (e.g., a driver circuit) or a circuit with passive components (e.g., an ESD protection circuit). Each contact pad 911a-914a is connected (e.g., by a corresponding through-silicon via (TSV) 911b-914b) to a corresponding backside pad 911c-914c, to provide connectivity to dies higher in the assembly 900. Because each ESD protection circuit of each semiconductor die 902-905 is provided with a dedicated contact pad (e.g., contact pads 912a and 914a), the assembly 900 can be configured with a desired amount of ESD protection for each driver circuit.

As can be seen with reference to FIG. 9, the substrate 901 includes two substrate contacts 921 and 922. The first substrate contact 921 is connected (e.g., by metallization features in the substrate 901) to two substrate backside contacts 921a and 921b, and is further connected (e.g., by solder balls 930) to the first contact pad 911a (corresponding to a driver circuit) of each semiconductor die 902-905 in the assembly 900, but is connected to the second contact pad 912a (corresponding to an ESD protection circuit) of only two semiconductor dies 902 and 903 in the assembly 900 (e.g., due to the omission of a solder ball that would provide a connection between the second contact pad 912a of the third semiconductor die 904 and the second backside contact pad 912c of the second semiconductor die 903). Similarly, the second substrate contact 922 is connected (e.g., by metallization features in the substrate 901) to two substrate backside contacts 922a and 922b, and is further connected (e.g., by solder balls 930) to the third contact pad 913a (corresponding to a driver circuit) of each semiconductor die 902-905 in the assembly 900, but is connected to the fourth contact pad 914a (corresponding to an ESD protection circuit) of only two semiconductor dies 902 and 903 in the assembly 900 (e.g., due to the omission of a solder ball that would provide a connection between the fourth contact pad 914a of the third semiconductor die 904 and the fourth backside contact pad 914c of the second semiconductor die 903). By leaving electrically disconnected from the substrate contacts 921 and 922 the second and fourth contact pads 912a and 914a (corresponding to ESD protection circuits) on the third and fourth semiconductor dies 904 and 905, the capacitance of the circuit to which each substrate contact 921 and 922 is connected is less than it would be if ESD protection circuits from each die in the assembly 900 were connected.

Figure 10:
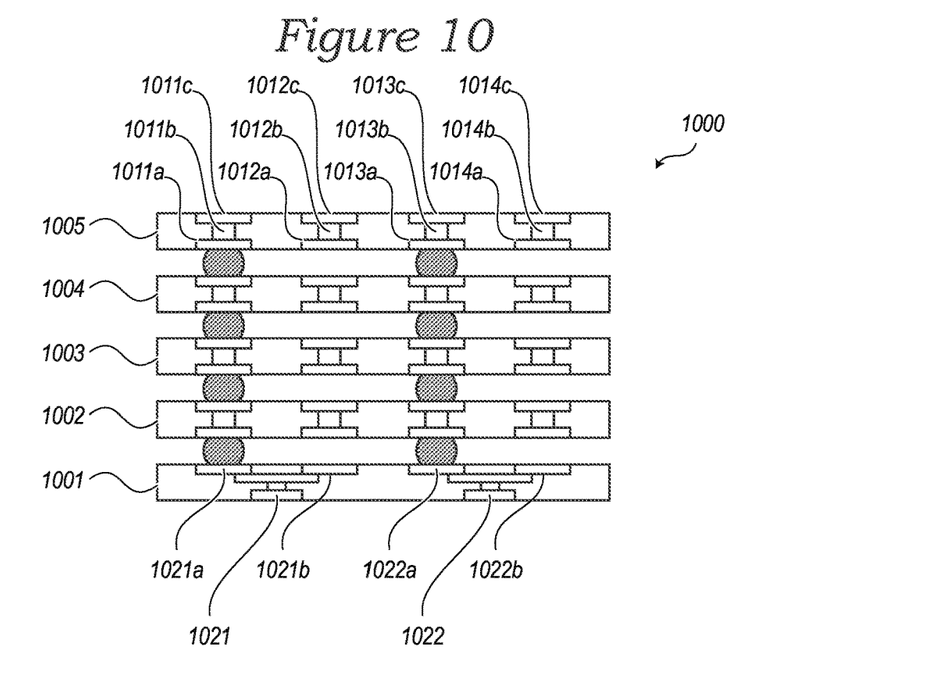

Although in the foregoing embodiments semiconductor device assemblies have been illustrated in which at least one die includes attached ESD protection circuits, in other embodiments of the present technology semiconductor device assemblies can include multiple dies, all of which include ESD protection circuits that are not connected (e.g., reliant on the inherent capacitance of the multiple driver circuits, such that there is no need for additional capacitance). For example, FIG. 10 is a simplified schematic cross-sectional view of a semiconductor device assembly 1000 in accordance with an embodiment of the present technology. Assembly 1000 includes a substrate 1001 and four semiconductor dies 1002-1005 (e.g., identical semiconductor dies), each including multiple contact pads, such as first through fourth contact pads 1011a-1014a, for providing connectivity to either a circuit with active components (e.g., a driver circuit) or a circuit with passive components (e.g., an ESD protection circuit). Each contact pad 1011a-1014a is connected (e.g., by a corresponding through-silicon via (TSV) 1011b-1014b) to a corresponding backside pad 1011c-1014c, to provide connectivity to dies higher in the assembly 1000. Because each ESD protection circuit of each semiconductor die 1002-1005 is provided with a dedicated contact pad (e.g., contact pads 1012a and 1014a), the assembly 1000 can be configured with a desired amount of ESD protection for each driver circuit.

As can be seen with reference to FIG. 10, the substrate 1001 includes two substrate contacts 1021 and 1022. The first substrate contact 1021 is connected (e.g., by metallization features in the substrate 1001) to two substrate backside contacts 1021a and 1021b, and is further connected (e.g., by solder balls 1030) to the first contact pad 1011a (corresponding to a driver circuit) of each semiconductor die 1002-1005 in the assembly 1000, but is connected to the second contact pad 1012a (corresponding to an ESD protection circuit) of none of the semiconductor dies 1002-1005 in the assembly 1000 (e.g., due to the omission of a solder ball that would provide a connection between the second contact pad 1012a of the first semiconductor die 1002 and the corresponding substrate backside contact pad 1021b). Similarly, the second substrate contact 1022 is connected (e.g., by metallization features in the substrate 1001) to two substrate backside contacts 1022a and 1022b, and is further connected (e.g., by solder balls 1030) to the third contact pad 1013a (corresponding to a driver circuit) of each semiconductor die 1002-1005 in the assembly 1000, but is connected to the fourth contact pad 1014a (corresponding to an ESD protection circuit) of none of the semiconductor dies 1002-1005 in the assembly 1000 (e.g., due to the omission of a solder ball that would provide a connection between the fourth contact pad 1014a of the first semiconductor die 1002 and the corresponding substrate backside contact pad 1022b). By leaving electrically disconnected from the substrate contacts 1021 and 1022 the second and fourth contact pads 1012a and 1014a (corresponding to ESD protection circuits) on all of the semiconductor dies 1002-1005, the capacitance of the circuit to which each substrate contact 1021 and 1022 is connected is less than it would be if ESD protection circuits from any of the dies in the assembly 1000 were connected.

Figure 11:
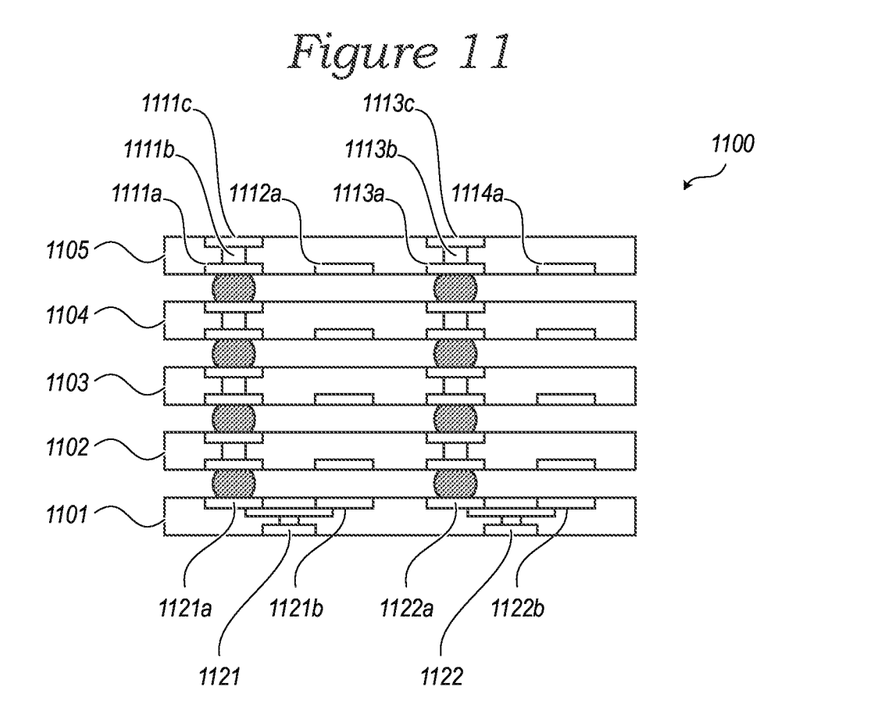

Although in the foregoing embodiments semiconductor device assemblies have been illustrated in which the dies includes TSVs connected to the ESD protection circuits thereof, in other embodiments of the present technology semiconductor device assemblies can include dies that include ESD protection circuits that are not connected to any TSV. For example, FIG. 11 is a simplified schematic cross-sectional view of a semiconductor device assembly 1100 in accordance with an embodiment of the present technology. Assembly 1100 includes a substrate 1101 and four semiconductor dies 1102-1105 (e.g., identical semiconductor dies), each including multiple contact pads, such as first through fourth contact pads 1111a-1114a, for providing connectivity to either a circuit with active components (e.g., a driver circuit) or a circuit with passive components (e.g., an ESD protection circuit). The contact pads 1111a and 1113a corresponding to the circuits with active components are connected (e.g., by corresponding TSVs 1111b and 1113b) to corresponding backside pads 1111c and 1113c, to provide connectivity to dies higher in the assembly 1100. TSVs and backside contact pads are not, however, provided for those contact pads 1112a and 1114a corresponding to circuits including only passive components.

As can be seen with reference to FIG. 11, the substrate 1101 includes two substrate contacts 1121 and 1122. The first substrate contact 1121 is connected (e.g., by metallization features in the substrate 1101) to two substrate backside contacts 1121a and 1121b, and is further connected (e.g., by solder balls 1130) to the first contact pad 1111a (corresponding to a driver circuit) of each semiconductor die 1102-1105 in the assembly 1100, but is connected to the second contact pad 1112a (corresponding to an ESD protection circuit) of none of the semiconductor dies 1102-1105 in the assembly 1100 (e.g., due to the omission of a solder ball that would provide a connection between the second contact pad 1112a of the first semiconductor die 1102 and the corresponding substrate backside contact pad 1121b). Similarly, the second substrate contact 1122 is connected (e.g., by metallization features in the substrate 1101) to two substrate backside contacts 1122a and 1122b, and is further connected (e.g., by solder balls 1130) to the third contact pad 1113a (corresponding to a driver circuit) of each semiconductor die 1102-1105 in the assembly 1100, but is connected to the fourth contact pad 1114a (corresponding to an ESD protection circuit) of none of the semiconductor dies 1102-1105 in the assembly 1100 (e.g., due to the omission of a solder ball that would provide a connection between the fourth contact pad 1114a of the first semiconductor die 1102 and the corresponding substrate backside contact pad 1122b). By leaving electrically disconnected from the substrate contacts 1121 and 1122 the second and fourth contact pads 1112a and 1114a (corresponding to ESD protection circuits) on all of the semiconductor dies 1102-1105, the capacitance of the circuit to which each substrate contact 1121 and 1122 is connected is less than it would be if ESD protection circuits from any of the dies in the assembly 1100 were connected.

Figure 12:
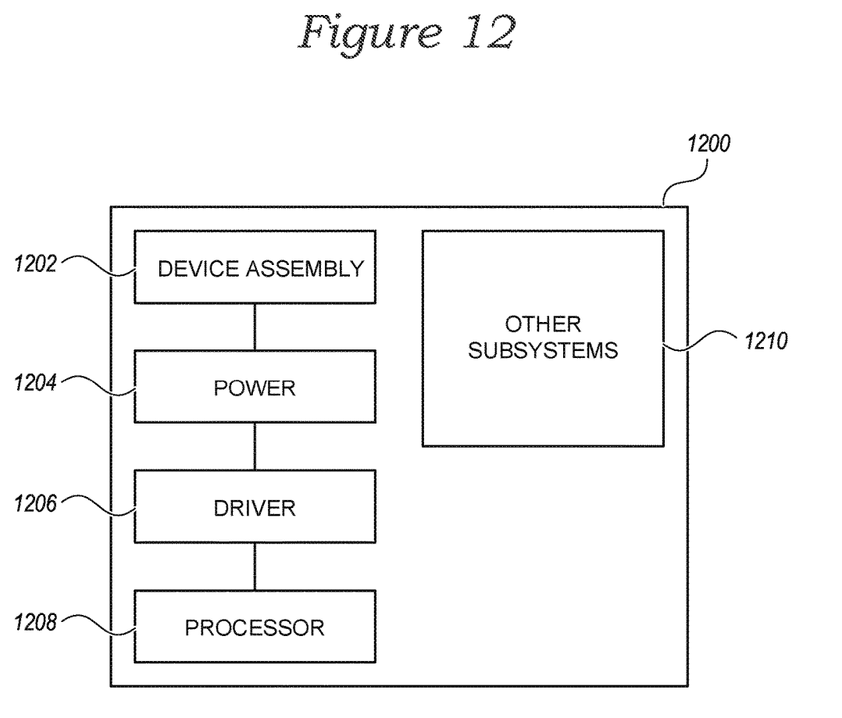
FIG. 12 is a schematic view showing a system that includes a semiconductor device assembly configured in accordance with an embodiment of the present technology.

Any one of the semiconductor device assemblies described above with reference to FIGS. 3-11 can be incorporated into any of a myriad of larger and/or more complex systems, a representative example of which is system 1200 shown schematically in FIG. 12. The system 1200 can include a semiconductor device assembly 1202, a power source 1204, a driver 1206, a processor 1208, and/or other subsystems or components 1210. The semiconductor device assembly 1202 can include features generally similar to those of the semiconductor devices described above with reference to FIGS. 3-11. The resulting system 1200 can perform any of a wide variety of functions, such as memory storage, data processing, and/or other suitable functions. Accordingly, representative systems 1200 can include, without limitation, hand-held devices (e.g., mobile phones, tablets, digital readers, and digital audio players), computers, vehicles, appliances and other products. Components of the system 1200 may be housed in a single unit or distributed over multiple, interconnected units (e.g., through a communications network). The components of the system 1200 can also include remote devices and any of a wide variety of computer readable media.

Figure 13:
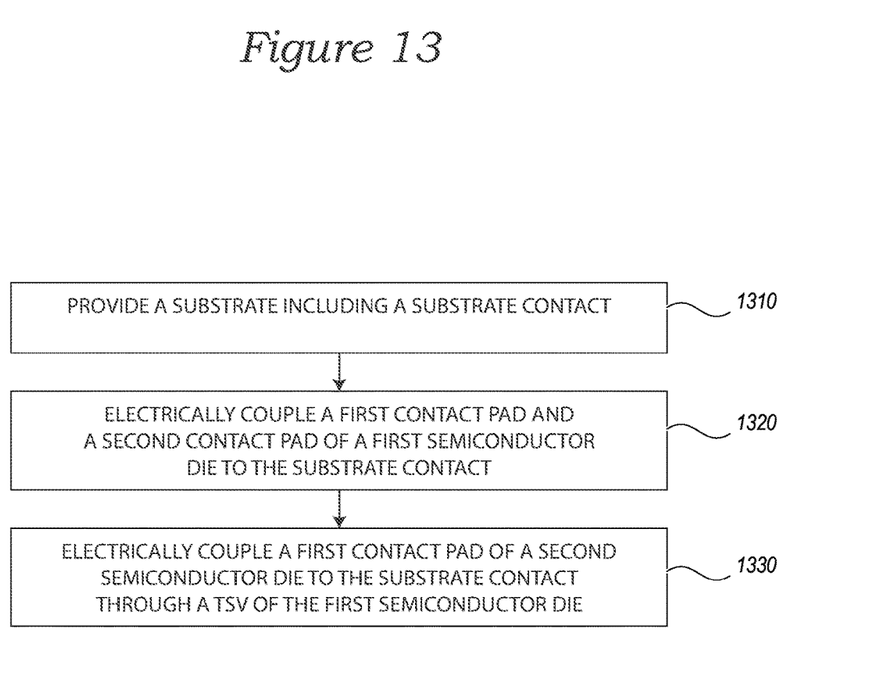
FIG. 13 is a flow chart illustrating a method of making a semiconductor device in accordance with an embodiment of the present technology.

FIG. 13 is a flow chart illustrating a method of making a semiconductor device assembly. The method includes providing a substrate that includes a substrate contact (box 1310) and coupling one or more semiconductor dies to the substrate (box 1320). Each of the one or more semiconductor dies includes a first contact pad electrically coupled to a first circuit on the semiconductor die including at least one active circuit element, and a second contact pad electrically coupled to a second circuit on the semiconductor die including only passive circuit elements. The method further includes electrically coupling the first contact pad of all of the one or more semiconductor dies to the substrate contact (box 1330) and electrically coupling the second contact pads of at least one of the one or more semiconductor dies to the substrate contact (box 1340).

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A semiconductor device assembly, comprising:
   a substrate; and
   a die coupled to the substrate, the die including:
      a first contact pad electrically coupled to a first circuit on the die including at least one active circuit element,
      a first through-silicon via (TSV) electrically coupling the first contact pad to a first backside contact pad of the die, and
      a second contact pad electrically coupled to a second circuit on the die including only passive circuit elements;
   wherein the substrate includes a substrate contact electrically coupled to both the first contact pad and the second contact pad on the die.

2. The semiconductor device assembly of claim 1, wherein the die further includes a second TSV electrically coupling the second contact pad to a second backside contact pad of the die.

3. The semiconductor device assembly of claim 1, wherein the die is a first die, further comprising:
   a second die including:
      a third contact pad electrically coupled to a third circuit on the second die including at least a second active circuit element,
      a third TSV electrically coupling the third contact pad to a third backside contact pad of the second die, and
      a fourth contact pad electrically coupled to a fourth circuit on the second die including only passive circuit elements;
   wherein the substrate contact is electrically coupled to the third contact pad on the second die, and
   wherein the fourth contact pad on the second die is electrically disconnected from the substrate contact.

4. The semiconductor device assembly of claim 3, wherein the first and second dies are identical dies, wherein the first contact pad on the first die corresponds to the third contact pad on the second die, and the second contact pad on the first die corresponds to the fourth contact pad on the second die.

5. The semiconductor device assembly of claim 3, wherein the second die is stacked over the first die and wherein the first backside contact pad of the first die is electrically coupled to the third contact pad of the second die by a solder joint.

6. The semiconductor device assembly of claim 3, wherein the first die further includes a fifth contact pad electrically coupled to a fifth circuit on the first die including only passive circuit elements, and wherein the substrate contact is electrically coupled to the fifth contact pad on the first die.

7. The semiconductor device assembly of claim 3, wherein the first die further includes a second TSV electrically coupling the second contact pad to a second backside contact pad of the die, and wherein the second die further includes a fourth TSV electrically coupling the fourth contact pad to a fourth backside contact pad of the die, and wherein the fourth contact pad on the second die is electrically disconnected from the substrate contact by an insulating gap between the second backside contact pad of the first die and the fourth contact pad of the second die.

8. The semiconductor device assembly of claim 1, wherein the first circuit is a driver circuit.

9. The semiconductor device assembly of claim 1, wherein the second circuit includes one or more capacitors to provide electrostatic discharge (ESD) protection.

10. The semiconductor device assembly of claim 1, wherein die is a NAND memory die.

11. A semiconductor device assembly, comprising:
    a substrate including a substrate contact; and
    a plurality of semiconductor dies, each including:
       a first contact pad electrically coupled to a first circuit on the semiconductor die including at least one active circuit element,
       a first through-silicon via (TSV) electrically coupling the first contact pad to a first backside contact pad of the semiconductor die, and
       a second contact pad electrically coupled to a second circuit on the semiconductor die including only passive circuit elements;
    wherein the first contact pads, the first TSVs, and the first backside contact pads of all of the plurality of semiconductor dies are electrically coupled to the substrate contact, and
    wherein the second contact pads of some, but less than all, of the plurality of semiconductor dies are electrically coupled to the substrate contact.

12. The semiconductor device assembly of claim 11, wherein the first circuit of each of the plurality of semiconductor dies is a driver circuit.

13. The semiconductor device assembly of claim 11, wherein the second circuit of each of the plurality of semiconductor dies includes one or more capacitors to provide electrostatic discharge (ESD) protection.

14. The semiconductor device assembly of claim 11, wherein the plurality of semiconductor dies are identical semiconductor dies.

15. The semiconductor device assembly of claim 11, wherein the plurality of semiconductor dies comprise NAND memory dies.

16. The semiconductor device assembly of claim 11, wherein the plurality of semiconductor dies comprises more than two semiconductor dies.

17. The semiconductor device assembly of claim 11, wherein each of the plurality of semiconductor dies further includes a second TSV electrically coupling the second contact pad to a second backside contact pad of the die, and wherein at least one of the second backside contact pads of one of the plurality of semiconductor dies is electrically coupled to a second contact pad of another one of the plurality of semiconductor dies by a solder joint.

18. A method of making a semiconductor device assembly, comprising:
   providing a substrate including a substrate contact;
   electrically coupling a first contact pad and a second contact pad of a first semiconductor die to the substrate contact, wherein the first contact pad is electrically coupled to a first circuit on the first semiconductor die including at least one active circuit element, and wherein the second contact pad is electrically coupled to a second circuit on the first semiconductor die including only passive circuit elements; and
   electrically coupling a first contact pad of a second semiconductor die to the substrate contact through a TSV of the first semiconductor die, wherein the first contact pad of the second semiconductor die is electrically coupled to a first circuit on the second semiconductor die including at least one active circuit element.

19. The method of claim 18, wherein the first and second semiconductor dies are identical semiconductor dies.

20. The method of claim 18, wherein the first circuit of each of the first and second semiconductor dies is a driver circuit.

21. The method of claim 18, wherein the second circuit of each of the first and second semiconductor dies includes one or more capacitors to provide electrostatic discharge (ESD) protection.

* * * * *